(12) United States Patent
Golubkov

(10) Patent No.: US 9,413,042 B2
(45) Date of Patent: Aug. 9, 2016

(54) MONITORING SYSTEM FOR AN ENERGY STORAGE CELL

(75) Inventor: Andrej Golubkov, Graz (AT)

(73) Assignee: Samsung SDI Co., Ltd., Yongin-si (KR)

( * ) Notice: Subject to any disclaimer, the term of this patent is extended or adjusted under 35 U.S.C. 154(b) by 421 days.

(21) Appl. No.: 13/634,599

(22) PCT Filed: Mar. 11, 2011

(86) PCT No.: PCT/EP2011/053717
§ 371 (c)(1),
(2), (4) Date: Sep. 13, 2012

(87) PCT Pub. No.: WO2011/117089
PCT Pub. Date: Sep. 29, 2011

(65) Prior Publication Data
US 2013/0002260 A1    Jan. 3, 2013

Related U.S. Application Data

(60) Provisional application No. 61/316,946, filed on Mar. 24, 2010.

(30) Foreign Application Priority Data

Oct. 13, 2010  (DE) .......................... 10 2010 048 379

(51) Int. Cl.
*H02J 7/00*  (2006.01)
*G01N 27/416*  (2006.01)
(Continued)

(52) U.S. Cl.
CPC .......... *H01M 10/48* (2013.01); *H01M 10/4257* (2013.01); *H01M 10/4264* (2013.01); *H01M 10/484* (2013.01); *H01M 10/486* (2013.01); *G01R 31/362* (2013.01)

(58) Field of Classification Search
CPC ............. H01M 4/90; H01G 9/00; H01G 9/02; H01G 9/04; G01R 31/36; H02J 7/0031
USPC .......................................... 320/134, 136, 132
See application file for complete search history.

(56) References Cited

U.S. PATENT DOCUMENTS 4,658,509 A * 4/1987 Juengel .......................... 33/558
6,163,131 A * 12/2000 Gartstein et al. .............. 320/118
(Continued)

FOREIGN PATENT DOCUMENTS

| CN | 100372167 C | 2/2008 |
|---|---|---|
| CN | 201048140 Y | 4/2008 |

(Continued)

OTHER PUBLICATIONS

Biyu Zhu, Chinese Patent Application No. 201180015329.X Search Report, Apr. 29, 2014, pp. 9-10, Electrics Invention Examination Department, Jiangsu Patent Examination Cooperation Center, China. English abstract submitted.

(Continued)

*Primary Examiner* — M'Baye Diao
(74) *Attorney, Agent, or Firm* — Lewis Roca Rothgerber Christie LLP

(57) ABSTRACT

A monitoring system for monitoring the state of an energy storage cell for storing electrical energy, in particular, an electrochemical energy storage cell or an energy storage cell having at least one capacitor. Integrated electronics for monitoring the state of the energy storage cell are arranged in the energy storage cell, the integrated electronics having a transmitting/receiving unit for wireless data exchange with a battery control system arranged outside the energy storage cell. Alternatively, the integrated electronics are connected to a transmitting/receiving unit for wireless data exchange with a battery control system arranged outside the energy storage cell.

17 Claims, 2 Drawing Sheets

(51) Int. Cl.
 *H01M 10/48* (2006.01)
 *H01M 10/42* (2006.01)
 *G01R 31/36* (2006.01)

(56) References Cited

U.S. PATENT DOCUMENTS

| | | | | |
|---|---|---|---|---|
| 6,329,786 | B1* | 12/2001 | Ono | G06F 1/26 |
| | | | | 307/66 |
| 7,133,271 | B2* | 11/2006 | Jonas | H01H 33/027 |
| | | | | 361/115 |
| 7,388,350 | B1* | 6/2008 | Wright | G08C 17/02 |
| | | | | 320/107 |
| 7,460,356 | B2* | 12/2008 | Ning | 361/507 |
| 7,495,574 | B2* | 2/2009 | Rocamora | G08C 17/02 |
| | | | | 307/112 |
| 7,723,947 | B2* | 5/2010 | Stenroos | H02J 7/0054 |
| | | | | 320/101 |
| 8,102,154 | B2* | 1/2012 | Bishop et al. | 320/136 |
| 8,310,201 | B1* | 11/2012 | Wright | G08C 17/02 |
| | | | | 320/107 |
| 8,551,643 | B2* | 10/2013 | Takeshita | H01M 2/1055 |
| | | | | 429/100 |
| 8,635,916 | B1* | 1/2014 | Loverich | G01L 5/0004 |
| | | | | 73/768 |
| 8,723,525 | B2* | 5/2014 | Stits | H01M 10/00 |
| | | | | 320/107 |
| 2005/0059441 | A1* | 3/2005 | Miyashita | 455/575.1 |
| 2005/0206530 | A1* | 9/2005 | Cumming | G01D 4/006 |
| | | | | 340/870.02 |
| 2006/0016553 | A1* | 1/2006 | Watanabe | 156/272.2 |
| 2006/0269826 | A1* | 11/2006 | Katz et al. | 429/42 |
| 2007/0038351 | A1* | 2/2007 | Larschan et al. | 701/35 |
| 2008/0173719 | A1* | 7/2008 | Wang | 235/492 |
| 2008/0204030 | A1* | 8/2008 | Brown et al. | 324/426 |
| 2008/0278115 | A1* | 11/2008 | Huggins | 320/134 |
| 2009/0050487 | A1* | 2/2009 | Fang | B23H 3/00 |
| | | | | 205/135 |
| 2010/0033108 | A1* | 2/2010 | Mironichev | 315/291 |
| 2011/0011700 | A1* | 1/2011 | Plathin et al. | 198/323 |

FOREIGN PATENT DOCUMENTS

| | | |
|---|---|---|
| DE | 19822571 A1 | 11/1999 |
| WO | 2006/082425 A1 | 8/2006 |
| WO | 2009/036444 A2 | 3/2009 |

OTHER PUBLICATIONS

Biyu Zhu, Chinese Patent Application No. 201180015329.X Search Report, Nov. 20, 2014, pp. 10-11, Electrics Invention Examination Department, Jiangsu Patent Examination Cooperation Center, China. English translation submitted.

* cited by examiner ial applications of voltage to the energy cells.
MONITORING SYSTEM FOR AN ENERGY STORAGE CELL

CROSS-REFERENCE TO RELATED APPLICATIONS

The present application is a National Stage Application of PCT International Application No. PCT/EP2011/053717 (filed on Mar. 11, 2011), under 35 U.S.C. §371, which claims priority to German Patent Application No. 10 2010 048 379.6 (filed on Oct. 13, 2010) and U.S. Provisional Patent Application No. 61/316,946 (filed on Mar. 24, 2010), which are each hereby incorporated by reference in their respective entireties

FIELD OF THE INVENTION

The invention relates to a monitoring system for monitoring the state of an energy storage cell for storing electrical energy, in particular an electrochemical energy storage cell or an energy storage cell comprising at least one capacitor.

The invention further relates to a battery system having a plurality of energy storage cells and a central battery control system for controlling and monitoring the energy storage cells.

Conventional battery systems are usually sub-divided into a plurality of modules. Each module comprises for its part a plurality of cells. The battery system can, for example, comprise 6 modules each having 10 cells. Battery systems that are sub-divided into a plurality of modules are generally used, for example, in the case of batteries for drive systems for hybrid or electric vehicles, where there is a high demand for energy.

Each of the conventional modules comprises a so-called "cell supervision circuit," referred to hereinunder as "CSC," the object of which is to monitor the voltage of the individual cells of the module, to compensate for any differences in voltage between the cells of the entire system (balancing) and to perform other functions relevant to safety, for example monitoring the temperature.

The CSCs of the individual modules usually communicate by means of a data bus having a battery control system for controlling and monitoring the energy cells. This battery control system is frequently referred to as a "battery management unit". In the explanations below, the battery control system or battery management unit is referred to in short as BMU. The control software of the battery system runs on the BMU. The BMU conventionally has a number of tasks. The most important of these for the present invention are: (a) the BMU decides which cells are to be balanced and for how long, in other words which cells are to be discharged (passive balancing) or likewise which cells are to be charged (active balancing); and (b) on the basis of data that is transmitted by the CSCs to the BMU, the control software decides whether the system is in a safe condition or whether action is required. This data includes, for example, the temperatures of the modules and all cell voltages.

CSCs, however, as are currently being used have a series of disadvantages as described in detail hereinunder.

The battery system comprises a plurality of cells. For example, the number of cells can easily be 400 or more in total, wherein it is necessary to monitor the voltage of each individual cell. If X cells are connected in parallel, it is only necessary to monitor every Xth cell, but this does require a voltage sampling cable. However, if only one of the thin voltage sampling conductors breaks, then the system must not be operated.

The voltage between the pins in the connector, at the site where the voltage sampling conductors are brought together on the CSC, can, for example, in the case of 12 cells amount to 50V per module. Condensation water and contamination can cause leakage currents and corrosion to occur at this site in the CSC.

Short circuits in the voltage sampling conductors and in the CSC are a source of a fault that is extremely difficult to overcome in conventional systems. It is difficult using conventional protective measures to protect the numerous voltage sampling conductors. Short circuits can be caused a) by mechanical abrasion or fracture, b) by foreign bodies, c) by lack of attention during the assembly process or during maintenance work and d) as a subsequent fault if there is a leakage of cooling fluid. For example, conductive material can be deposited on adjacent voltage-carrying conductors as a result of electrolysis of the cooling fluid and such deposits can form a bridge for the short circuit.

The many parts that conduct voltage to ground also increase the probability of a ground fault and the risk of an electric shock for people working on the battery system.

Also, it is necessary to modify the CSCs in parts to suit new battery systems and to develop new CSCs.

In addition, it is extremely difficult in the case of Li-ion batteries to detect lithium deposits (lithium dendrites) on an overloaded anode. In the worst case scenario, the lithium dendrites can cause damage to a separator film and as a further consequence lead to an internal short circuit in the cell.

SUMMARY OF THE INVENTION

It is, therefore, an object of the invention to increase the safety of the battery system whilst simultaneously minimizing the costs relating to the material and the assembly process without adversely affecting the monitoring functions.

The object is achieved in accordance with the invention with a monitoring system of the type mentioned in the introduction, by virtue of the fact that integrated electronics for monitoring the state of the energy storage cell are arranged in the energy storage cell, wherein the integrated electronics have a transmitting/receiving unit for preferably wireless data exchange with a battery control system arranged outside the energy storage cell or said integrated electronics are connected to a transmitting/receiving unit for preferably wireless data exchange with a battery control system arranged outside the energy storage cell.

The solution in accordance with the invention renders it possible on the one hand to improve the protection of people and on the other hand to determine more precisely the chemical state of the individual cells. The wireless communication between the integrated electronics and the battery control system renders it possible to transmit data in a particularly secure and simple manner.

As an alternative to using wireless data transmission between the integrated electronics and the battery control system, it is possible to provide a data transmission path between the integrated electronics and the battery control system from an electrical data bus or from a main power cable on which a signal can be modulated.

A further embodiment of the invention that is characterized by a comparatively low level susceptibility to electromagnetic damage provides that the integrated electronics are connected to the battery control system by means of an optical transmission path, in particular by means of an infra-red transmission path with and without an electrically insulating fiber optic cable.

In accordance with one variant of the invention that is characterized by the state of the energy cell being detected in a particularly reliable manner, it can be provided that the integrated electronics comprise sensors or are connected to sensors that are arranged in the energy storage cell in order to detect the temperature and/or the charge state and/or the chemical decomposition products of the energy storage cell.

The energy storage cell can be passively balanced in a simple manner by virtue of the fact that the integrated electronics comprise a switchable discharge resistor.

The charge state of the energy storage cell can be determined in a particularly precise and reliable manner by virtue of the fact that the integrated electronics include a reference electrode for measuring separately an anode potential and cathode potential of the energy storage cell.

It is possible to identify an energy storage cell and thus clearly allocate a malfunction or a correct operating state to this energy storage cell by virtue of the fact that the integrated electronics comprise an identification code that is stored in a memory of the integrated electronics. This identification code can be an alpha-numeric code, for example a serial number of a chip of the integrated electronics or of the energy storage cell.

A variant of the invention that is characterized by requiring a comparatively small amount of space and by having good processing properties during the process of manufacturing the energy storage cell provides that the integrated electronics are arranged on a carrier film. It is of particular advantage in this connection, if the energy storage cell is a cell manufactured using thin film technology.

A particular advantageous embodiment of the invention that renders it possible to analyze the usage of the energy storage cell provides that the integrated electronics are designed to store data relating to the cell usage.

The abovementioned object can also be achieved in accordance with the invention with a battery system of the type mentioned in the introduction by virtue of the fact that the battery system comprises a monitoring system in accordance with the invention.

BRIEF DESCRIPTION OF THE DRAWINGS

The invention and further advantages are described in detail hereinunder with reference to some exemplary embodiments that are non-limiting and are illustrated in the drawings in which schematically.

DETAILED DESCRIPTION OF EMBODIMENTS

It is stated by way of introduction that the present invention is not limited to the use of electrochemical energy storage cells (e.g., Lithium ion cells), but rather can also be used with other types of energy storage devices or energy storage cells, for example capacitors and in particular double-layer capacitors.

Figure 1:
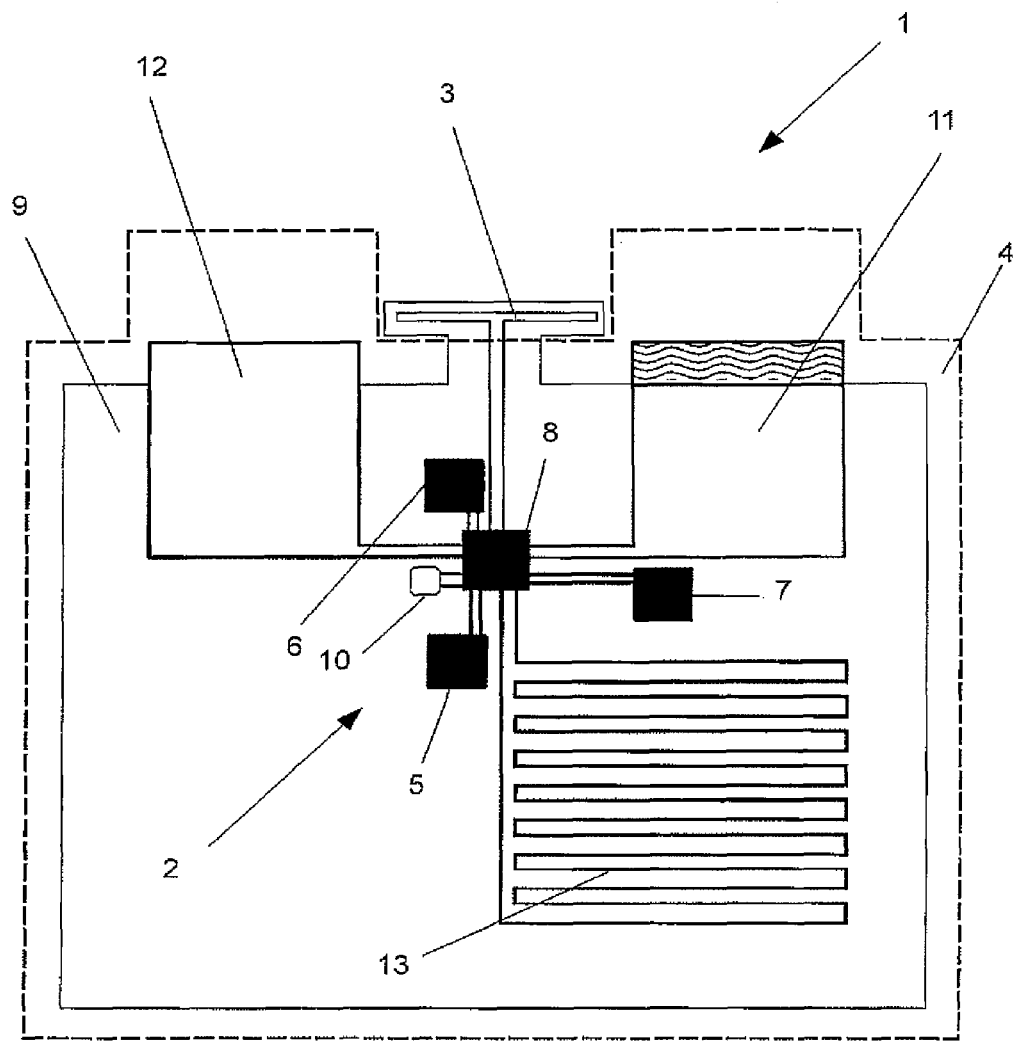
FIG. 1 illustrates an energy storage cell with a first variant of a monitoring system in accordance with the invention for an energy storage cell.
Figure 2:
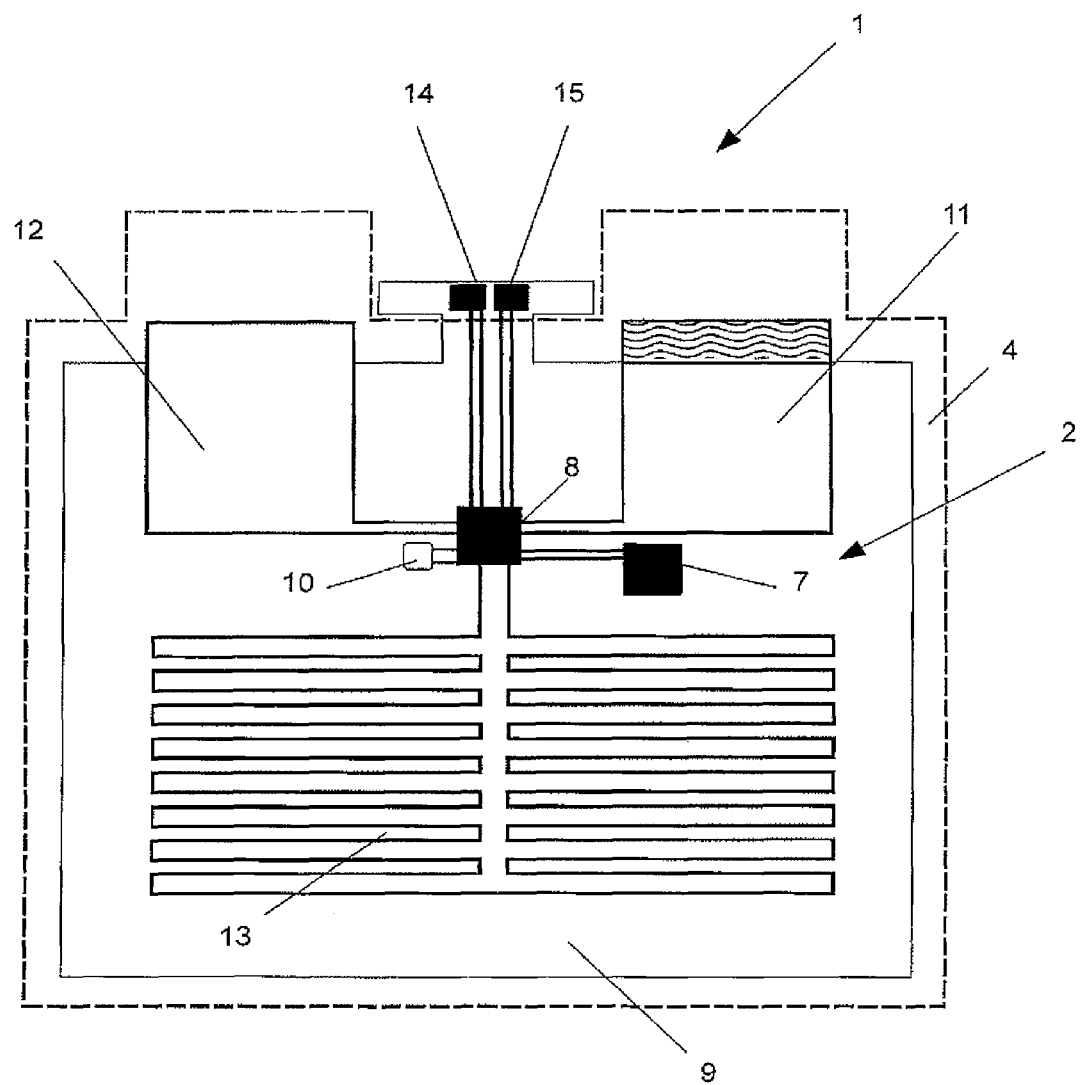
FIG. 2 illustrates an energy storage cell with a second variant of a monitoring system in accordance with the invention.

As illustrated in FIG. 1, in the case of an energy storage cell 1 in accordance with the invention, the CSCs usually used in the prior art are replaced by electronics 2 integrated directly in the energy storage cell 1, which electronics are designated hereinunder as an Integrated Cell Circuit or ICC in short. A plurality of energy storage cells 1 in accordance with the invention, as illustrated in FIG. 1 or FIG. 2, can be combined to form a battery system. Each energy storage cell 1 can communicate, preferably in a wireless manner, by means of its installed ICC 2 with a BMU of the battery system (the BMU is not illustrated here in detail). For this purpose, the ICC 2 can comprise a transmitting/receiving unit 3 for the wireless data exchange with the BMU arranged outside the energy storage cell 1 or connected to a corresponding transmitting/receiving unit 3. The ICC 2 is preferably designed for bi-directional communication with the BMU.

It is possible, for example, to use the radio-based communication technology of the RFID as the communication technology for transmitting data between the ICC 2 and the BMU. Alternatively, it would also be possible to communicate between the ICC 2 and the BMU by means of a modulated signal on the main current cables or by means of an electrical data bus. An optical data transmission path could also be provided between the ICC 2 and the BMU.

The maximum voltage prevailing in a conventional Li-ion cell that is used as an energy storage cell 1 usually amounts to 4.2V. Since the ICC 2 is located inside the energy storage cell 1, the ICC never sees a voltage greater than 4.2V when using a Li-ion cell as the energy storage cell 1. The voltage to be controlled is consequently much lower than the 50V that prevails in a conventional CSC.

In the presence of a current loading, voltage drops off at the transfer resistors of the energy storage cell 1. Since the ICC 2 measures the voltage directly in the energy storage cell 1, the fault caused by the voltage drop at the transfer resistors can also be minimized. By installing the ICC 2 in a hermetically sealed cell housing 4 of the energy storage cell 1, it is also possible to greatly minimize the possibilities of an internal short circuit occurring (between two cells or between cells and ground).

The expenditure relating to the assembly process and maintenance work in the case of the solution in accordance with the invention is considerably reduced in comparison to conventional solutions since the CSC and the voltage sampling cable are omitted. In addition, the energy storage cells 1 in accordance with the invention can be more easily replaced.

In addition, the ICC 2 can comprise sensors 5, 6, 7 or be connected to sensors 5, 6, 7 arranged in the energy storage cell 1 in order to detect the temperature and/or the charge state and/or the chemical decomposition products and/or the pressure of the energy storage cell 1. The state of the energy storage cell 1 can be detected even more precisely by using a chemical sensor 5. For example, chemical decomposition products can be measured that indicate an imminent failure of the energy storage cell 1. By using the chemical sensor 5 that can react to decomposition products of the battery components of the energy storage cell 1, it is also possible to determine the state of aging and the residual capacity. In addition, it is possible to provide a warning prior to an imminent complete failure of the energy storage cell 1. As a consequence, it is also possible to identify the defective cells even when a plurality of energy storage cells 1 is connected in parallel. This would not be possible using merely a voltage measurement since the parallel-connected energy storage cells 1 automatically also have an identical voltage.

It is possible, for example, using the pressure sensor 6 to determine the gas pressure in a metal can cell. The value determined for the gas pressure can then be used to calculate the state of aging of the cell.

A sensor integrated in an ICC chip 8 or also a dedicated component on an ICC carrier film 9 could possibly be used as a temperature sensor 7. Preferably, the temperature sensor 7 should be able to measure a temperature in the range from −30 to +70° C. with accuracy less than 2° C. For reasons of cost, it would also be possible to equip only a specific percentage of the energy storage cells 1 of a battery system in accordance with the invention with a temperature sensor 7. In the event that a cost-effective thin-film technology is used to manufacture the temperature sensors 7, it could, however, also be possible to distribute a matrix of temperature sensors 7 over the entire surface of the carrier film 9 of the ICC 2. As a consequence, hot-spots during the operation of the energy storage cell 1 can be recognized at an early stage.

In addition, the potentials of the anode and the cathode can be measured separately by virtue of optionally installing a reference electrode 10 in the ICC 2. As a consequence, the charge state of the energy storage cell 1 can be determined in a more precise manner. The use of the additional reference electrode 10 can also produce decisive advantages when determining the chemical state of the energy storage cell 1. The reference electrode 10 can, for example, be embodied from pure lithium or from platinum and should not participate in the electrochemical reactions of the energy storage cell 1. Safety problems can also be avoided by virtue of the comparatively small size of the reference electrode 10. By virtue of measuring the anode potential and the cathode potential separately, it is also possible to obtain additional information for determining the charge state and the aging effects of the energy storage cell 1. In addition, additional information can be obtained regarding the state of health, in short SOH, of the energy storage cell and can be transmitted to the BMU. In particular, in the case of the known anode potential, it is possible to recognize any lithium deposits that are critical from the point of view of safety.

As illustrated in FIG. 1 and already mentioned hereinabove in part, the ICC 2 can comprise an ICC chip 8, a carrier film 9, a reference electrode 10, voltage sampling points 11, 12, a chemical sensor 5, a pressure sensor 6, a temperature sensor 7, a film resistor 13 and a transmitting/receiving unit 3 that is embodied in this case as an antenna.

The film resistor 13 can be used for the passive balancing of the energy storage cell 1. The film resistor 13 can be connected in parallel to the cell electrodes by means of a transistor. Consequently, a controlled balancing process is possible. If there is sufficient energy output, it would also be possible to heat the energy storage cell 1, so that the energy storage cell 1 could be retained more easily in the ideal operating range. The transistor could, for example, be embodied using MOSFET technology. This type of film resistor is already commercially available and is known to the person skilled in the art.

The ICC 2 can be achieved on the carrier film 9 using "Flexible Electronics" technology. For example, RFID tags have been manufactured for some time now using this technology. The ICC chip 8 itself can therefore be manufactured using the same technology as conventional RFID chips. RFID chips are available miniaturized down to a size of 50 µm×50 µm (Hitachi). The ICC chip 8 can, for example, perform the following functions: (a) radio communication with the BMU, (b) precise analog/digital conversion of the cell voltage, (c) measure the temperature (internally or by means of additional components), (d) switch in the film resistor 13 for balancing, and (e) read out the optional sensors 5, 6, 7. The ICC chip 8 functions preferably in an energy-saving manner and thus only slightly increases the self-discharge of the energy storage cell 1. Ideally, it is possible to provide an activatable energy-saving mode in the case of a system that is not in operation.

The carrier film 9 is preferably not very thick, so that the volume of the energy storage cell 1 is not increased substantially. The ICC carrier film 9 can be assembled together with the anode film, cathode film and separator film stacked to form the energy storage cell 1. In general, the ICC 2 can be integrated in a similar manner to the conventional cathode film and anode film, so that no additional novel processes are required to assemble the cell. As previously, the anode film, cathode film and separator film can be stacked one on top of the other to assemble the energy storage cell 1. In addition, the ICC carrier film 9 is also added. Current collectors on the cathode and anode side can be welded. The cell voltage sampling points of the ICCs 2 can be simultaneously welded during the same procedural step. Laminated outer films can be positioned in place and (synthetic material-) welded to the seal edges. In so doing, the antenna lug/LED lug is to protrude outwards through the seal seam. The antenna lug/LED lug can then be bent over and adhered on the outside to the cell outer surface. The further steps of the manufacturing process can be performed as in the case of the energy storage cells already known from the prior art.

Advantageously, the ICC carrier film 9 is a constant thickness throughout. Any thickened areas in the ICC carrier film 9 could otherwise push into the cathode film and the anode film and damage them. The pressure is created in the case of pouch cells by virtue of the external mechanical attachment of the cell in the battery system or in the case of metal-can cells by virtue of the rigid cell housing and the expansion of the anode material and the cathode material, as a result of aging and cyclic operation, inside the cell. The invention can be used in the case of each of the cell types mentioned but is not limited thereto, thus the monitoring electronics in accordance with the invention, for example, could also be used in a cylindrical energy storage device/cell. In order to be protected from the electrolyte, the ICC 2 can be sealed on both sides by means of synthetic films.

Also, on the basis of the solution in accordance with the invention, a cell packaging can be embodied in a more flexible manner. For example, it is possible in a simpler manner than hitherto to achieve battery systems having a different number of energy storage cells 1, the number of the energy storage cells 1 in the battery system is not required to be a multiple of the cells per module. Also, special modules that are half filled with cells are not required.

Log data relating to the usage of the energy storage cell 1 can be stored in the ICC chip 8 and analyzed during recycling or during a service.

On the one hand, the voltage sampling points 11 and 12 are required for supplying current to the ICC 2 and on the other hand, for example, the cell voltage of the energy storage cell 1 can be measured. The accuracy of the voltage measurement should be relatively high, ideally better than 10 mV with a voltage range of 0V to 4.5V. The voltage sampling points of the ICC 2 are constructed in a favorable manner, (mechanically) compatible with the current collector films used in the cell, depending upon the material used in the cell, for example aluminum and copper. The voltage sampling points 11 and 12 could then be simply welded simultaneously during the same procedural step in which the current collectors are welded. Whereas, for example, the anode-side current collectors are embodied as copper films, aluminum film is used, for example, on the cathode side. 'Flexible electronics' electrical circuits are usually embodied with copper strip conductors. It is therefore easy to perform the welding process on the anode side. On the cathode side, either the entire voltage sampling point 11 can be manufactured from aluminum or a material transition copper-aluminum can be produced—either directly on the weld lug if the welding process permits or beforehand between the ICC chip 8 and the anode weld site.

As already mentioned hereinabove, the communication of the individual ICCs 2 with the BMU can be achieved using different technologies as follows: (1) Communication by means of electromagnetic radio, based on RFID technology;

(2) Optical data transmission using infrared transceivers, without a light conducting cable; (3) Optical data transmission using infrared transceivers, with a light conducting cable; (4) Communication by means of a signal modulated on the main power cables; and (5) Communication by means of a conventional, electrical data bus.

Depending upon the communication technology used, other system components are required for communication purposes.

In the event of radio communication between the ICC 2 and BMU, an ICC antenna is provided. Since the radio signal cannot pass through metal, the radio path from the ICC antenna to the BMU antenna should be free of metal. However, it is not necessary for the radio path to be straight, since the radio waves can be reflected at the metal walls. It follows from this, that Li-ion cells, for example, usually comprise a metal housing. In the case of pouch cells, an aluminum layer can be welded into the outer film as a diffusion barrier for the electrolyte fluid, in the case of metal-can cells the housing is usually produced completely from metal. In order to render it possible to create a radio connection, the ICC film in the case of pouch cells can comprise an additional lug having antenna conductor strips. Since the outer films are positioned in place during the process of manufacturing the cell, the antenna lug is allowed to protrude outwards through the seal seam. The antenna is now outside the cell housing. The lug can finally be bent over and adhered to the cell outer wall (e.g. to the seal seam). The site at which the antenna lug is embodied can be selected such that it is possible to provide in the battery system a favorable radio connection to the BMU.

In the case of metal-can cells, the situation is more difficult than in the case of pouch cells. The object is achieved, for example, by virtue of a plastic or synthetic material window that is transparent to the radio frequency and is provided at a suitable site on the metal housing. The window can be embodied in such a manner that it is used simultaneously as the pressure-relief valve.

It is also possible, however, to use other bi-directional communication technologies as an alternative option to the radio technologies. For example, the information could be transmitted by means of modulating the communication carrier signal onto the main current connectors.

As illustrated in FIG. 2, an LED 14 and a light sensor 15 having a lug directed towards the outside could also be provided, in place of an antenna. Corresponding interacting sites can be distributed over the battery housing. The communication between the energy storage cell 1 and the BMU would be performed optically in this case. This variant is characterized inter alia by a good level of electromagnetic compatibility. It would also be possible, however, to connect each energy storage cell 1 by means of a fiber optic cable to the BMU. As a consequence, problems arising from contamination would be primarily eradicated. Alternatively, data could be transferred between the ICC 2 and the BMU using a conventional, serial electrical data bus. Each ICC 2 of the energy storage cells 1 of the battery system in accordance with the invention could be connected in this case electrically to the data bus. Further feed-throughs through the cell housing are not required. In this case, the transceiver of the ICC is advantageously well insulated from the other components of the energy storage cell 1, so that there is no high voltage potential at the data bus.

In accordance with an advantageous variant of the invention, each ICC chip 8 can have a unique ID-code, hereinunder referred to in short as ID, so that each ICC can be clearly identified. The use of an ID also renders it possible to achieve a communication protocol between the individual ICCs and the BMU. In accordance with a simple communication protocol, each energy storage cell 1 can identify itself using its ID to the BMU as the battery system is being switched on. Preferably, an anti-collision method is used, so that two ICCs 2 do not simultaneously transmit. As soon as the number of energy storage cells 1 that have registered with the BMU corresponds to the number of energy storage cells 1 in the battery system, the operational communication can be allowed.

During the operational communication, the BMU can work through the IDs of the cells consecutively and after the last ID start back with the first ID. In so doing, the BMU transmits an enquiry in the case of each ID and the ICC 2 reports the state of its energy storage cell to the BMU using the correct ID. The enquiry from the BMU can also include an instruction for balancing the corresponding energy storage cell 1.

In the event that one of the ICCs 2 does not respond, then the enquiry can be repeated by the BMU. In the event that no response is received after further attempts to communicate, then the battery system can be switched off for safety reasons.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

LIST OF REFERENCE NUMERALS

Energy storage cell 1
Integrated electronics 2
Transmitting/receiving unit 3
Cell housing 4
Chemical sensor 5
Pressure sensor 6
Temperature sensor 7
ICC chip 8
Carrier film 9
Reference electrode 10
Voltage sampling point, cathode 11
Voltage sampling point, anode 12
Film resistor 13
LED 14
Light sensor 15

The invention claimed is:

1. A monitoring system for an energy storage cell comprising a cell housing, the monitoring system comprising:
   integrated electronics comprising a sensor and a transmitting/receiving unit, the sensor being arranged inside the cell housing and configured to monitor a state of the energy storage cell, the transmitting/receiving unit configured to wirelessly exchange data relating to the state of the energy storage cell with a battery management unit, a part of the transmitting/receiving unit being arranged outside of the cell housing.

2. The monitoring system of claim 1, further comprising an electrical data bus configured to provide a data transmission path between the integrated electronics and the battery management unit on a main power cable on which a signal can be modulated.

3. The monitoring system of claim 1, further comprising a power cable configured to provide a data transmission path between the integrated electronics and the battery management unit.

4. The monitoring system of claim 1, wherein the sensor is configured to detect at least one of temperature, charge state, or chemical decomposition products of the energy storage cell.

5. The monitoring system of claim 1, wherein the integrated electronics further includes a resistor.

6. The monitoring system of claim 5, wherein the resistor comprises a switchable discharge resistor.

7. The monitoring system of claim 1,
wherein the integrated electronics further includes a reference electrode configured to separately measure an anode potential and a cathode potential of the energy storage cell.

8. The monitoring system of claim 1, further comprising a reference electrode operatively connected to the integrated electronics and configured to separately measure an anode potential and a cathode potential of the energy storage cell.

9. The monitoring system of claim 1, wherein:
the integrated electronics further includes a memory device; and
an identification code is stored in the memory device.

10. The monitoring system of claim 1, further comprising a carrier film upon which the integrated electronics are arranged.

11. The monitoring system of claim 1, wherein the integrated electronics are configured to store data relating to usage of the energy storage cell.

12. An energy storage cell for a battery system, the energy storage cell comprising:

an energy cell housing comprising metal and having a window arranged at an outer side of the energy cell housing, the window comprising plastic or glass; and
a monitoring system configured to monitor a state of the energy storage cell, the monitoring system including:
integrated electronics arranged inside the energy cell housing; and
a transmitting/receiving unit arranged inside the energy cell housing and operatively connected to the integrated electronics, and configured to wirelessly exchange data relating to the state of the energy storage cell with a battery management unit.

13. The energy storage cell of claim 12, further comprising sensors operatively connected to the integrated electronics, the sensors being configured to detect at least one of temperature, charge state, or chemical decomposition products of the energy storage cell.

14. The energy storage cell of claim 12, wherein the integrated electronics are operatively connected via an optical transmission path.

15. The energy storage cell of claim 12, further comprising a reference electrode operatively connected to the integrated electronics and configured to separately measure an anode potential and a cathode potential of the energy storage cell.

16. The storage energy cell of claim 12, wherein:
the integrated electronics further includes a memory device; and
an identification code is stored in the memory device.

17. The energy storage cell of claim 14, wherein the optical transmission path comprises an infrared transmission path.

* * * * *